United States Patent
Hiatt et al.

(10) Patent No.: US 6,803,303 B1
(45) Date of Patent: Oct. 12, 2004

(54) METHOD OF FABRICATING SEMICONDUCTOR COMPONENT HAVING ENCAPSULATED, BONDED, INTERCONNECT CONTACTS

(75) Inventors: William M. Hiatt, Eagle, ID (US); Warren M. Farnworth, Nampa, ID (US); Charles M. Watkins, Boise, ID (US); Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/193,567

(22) Filed: Jul. 11, 2002

(51) Int. Cl.⁷ .............................................. H01L 21/44
(52) U.S. Cl. ...................... 438/612; 438/614; 438/617
(58) Field of Search ............................... 438/612–617; 257/737–740

(56) References Cited

U.S. PATENT DOCUMENTS

| | | | |
|---|---|---|---|
| 5,908,317 A | * | 6/1999 | Heo ............................ 438/617 |
| 6,048,755 A | | 4/2000 | Jiang et al. |
| 6,091,141 A | | 7/2000 | Heo |
| 6,118,179 A | | 9/2000 | Farnworth et al. |
| 6,180,504 B1 | | 1/2001 | Farnworth et al. |
| 6,252,301 B1 | | 6/2001 | Gilleo et al. |
| 6,303,997 B1 | | 10/2001 | Lee |
| 6,331,737 B1 | | 12/2001 | Lim et al. |
| 6,365,439 B2 | | 4/2002 | Miyazaki et al. |
| 6,368,896 B2 | | 4/2002 | Farnworth et al. |
| 6,369,454 B1 | | 4/2002 | Chung |
| 6,400,172 B1 | | 6/2002 | Akram et al. |
| 6,429,675 B2 | * | 8/2002 | Bell ............................ 324/765 |
| 6,465,877 B1 | | 10/2002 | Farnworth et al. |
| 6,476,503 B1 | * | 11/2002 | Imamura et al. ............ 257/780 |
| 6,620,731 B1 | | 9/2003 | Farnworth et al. |

* cited by examiner

Primary Examiner—Thanh Nguyen
(74) Attorney, Agent, or Firm—Stephen A. Gratton

(57) ABSTRACT

A semiconductor component includes a die having a pattern of die contacts, and interconnect contacts bonded to the die contacts and encapsulated in an insulating layer. The component also includes terminal contacts formed on tip portions of the interconnect contacts. Alternately the component can include conductors and bonding pads in electrical communication with the interconnect contacts configured to redistribute the pattern of the die contacts. A method for fabricating the component includes the steps of forming the interconnect contacts on the die contacts, and forming the insulating layer on the interconnect contacts while leaving the tip portions exposed. The method also includes the step of forming the terminal contacts on the interconnect contacts, or alternately forming the conductors and bonding pads in electrical communication with the interconnect contacts and then forming the terminal contacts on the bonding pads.

47 Claims, 6 Drawing Sheets

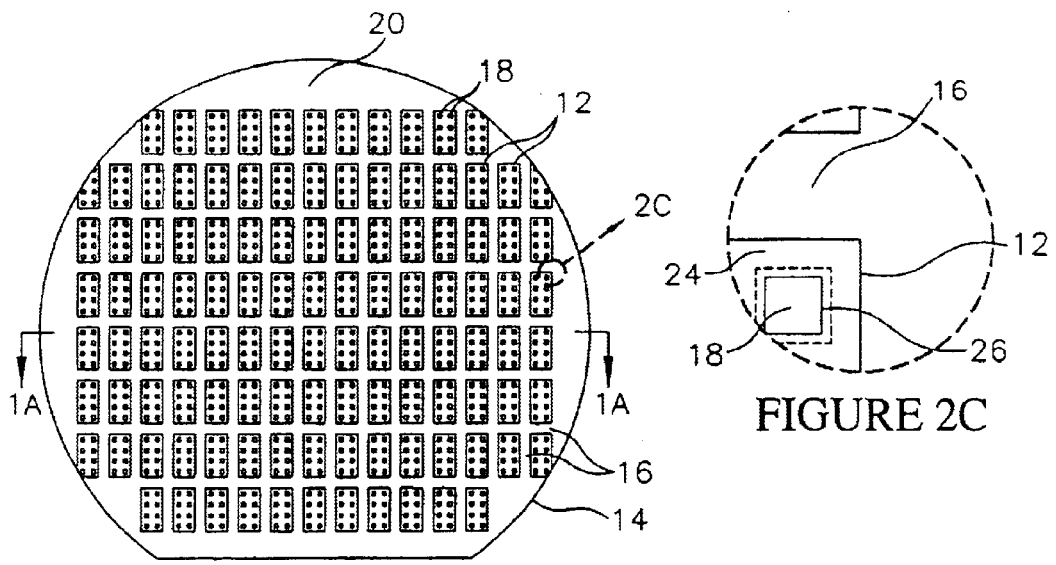
FIGURE 2A
FIGURE 2C
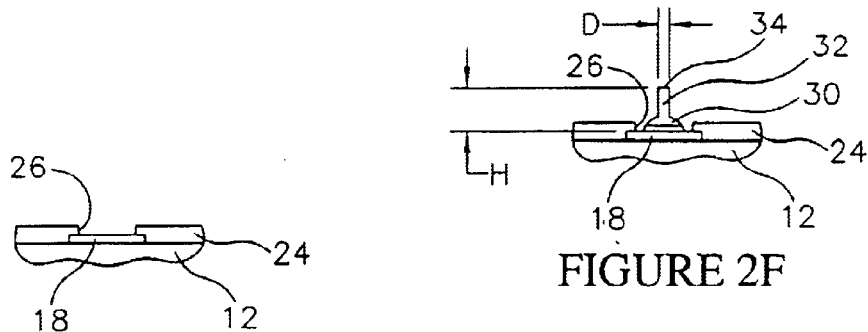
FIGURE 2B
FIGURE 2F
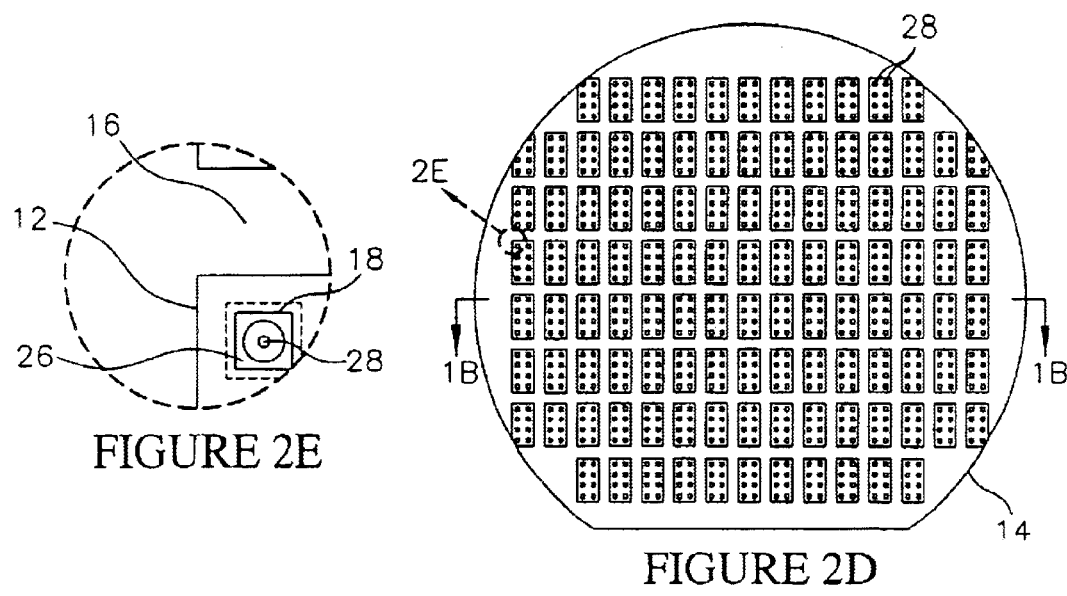
FIGURE 2E
FIGURE 2D

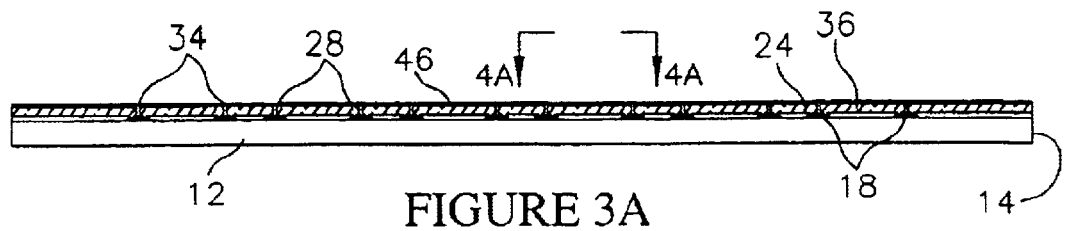
FIGURE 3A
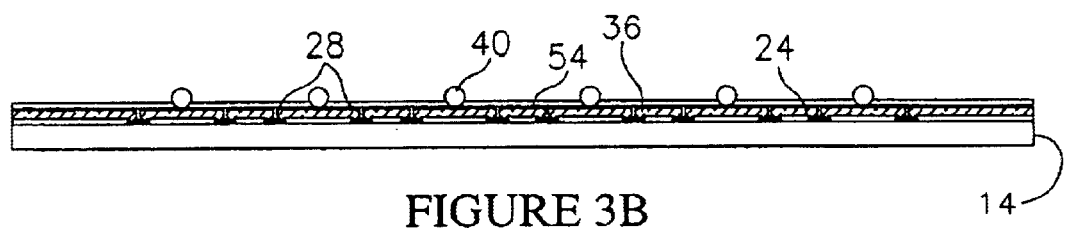
FIGURE 3B
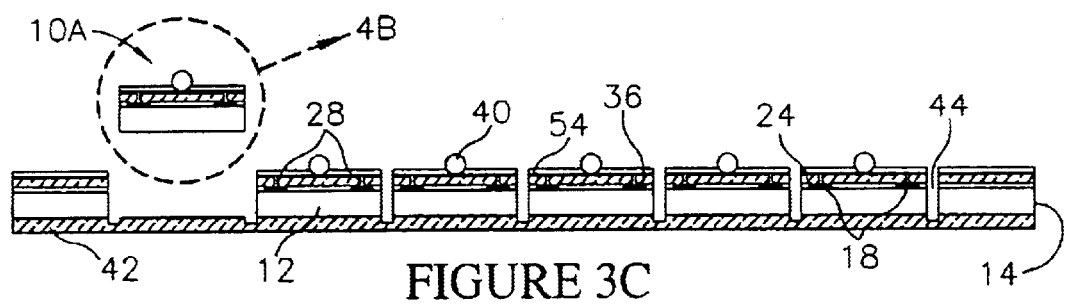
FIGURE 3C
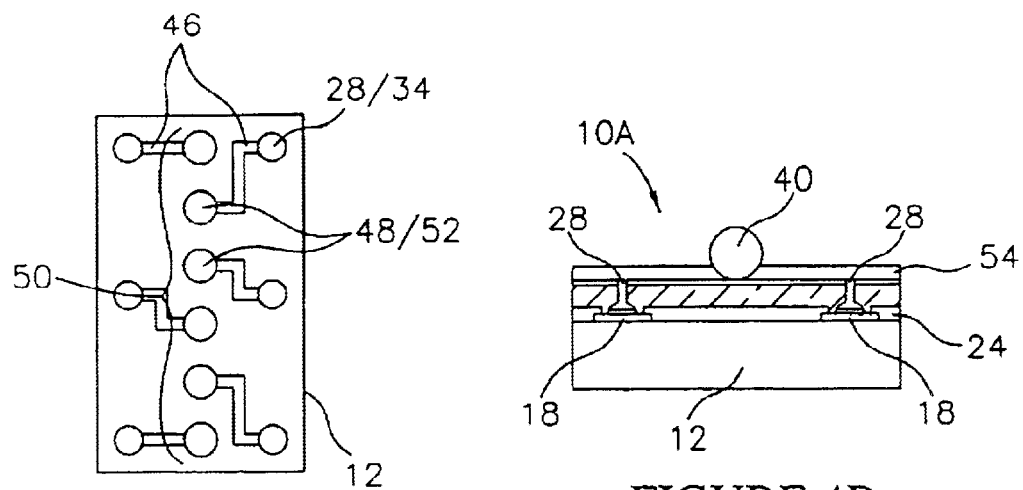
FIGURE 4A
FIGURE 4B

METHOD OF FABRICATING SEMICONDUCTOR COMPONENT HAVING ENCAPSULATED, BONDED, INTERCONNECT CONTACTS

FIELD OF THE INVENTION

This invention relates generally to semiconductor manufacture and packaging. More particularly, this invention relates to a semiconductor component having encapsulated bonded, interconnect contacts, to a method for fabricating the component, and to systems incorporating the component.

BACKGROUND OF THE INVENTION

Semiconductor components, such as chip scale packages, BGA devices, flip chip devices, and bumped dice include terminal contacts such as bumps, balls, pins or pads. The terminal contacts can be formed directly on the dice, or on substrates attached to the dice. Typically, the components also include protective layers which insulate one or more surfaces of the dice, and provide electrical insulation for the terminal contacts, and for conductors associated with the terminal contacts. The quality, reliability and cost of these types of components are often dependent on the fabrication method for the terminal contacts.

As the components become smaller, and the terminal contacts more dense, fabrication methods become more difficult. In particular, reliable electrical connections must be made between the terminal contacts for the components, and die contacts on the dice contained within the components. Typically, the die contacts are thin film aluminum bond pads in electrical communication with integrated circuits. The intermediate connections between the die contacts and the terminal contacts are referred to herein as "interconnect contacts".

One type of interconnect contact comprises wires bonded at one end to the die contacts, and at an opposing end to bonding pads in electrical communication with the terminal contacts. These interconnect contacts are relatively fragile and can separate from the die contacts and become entangled. Another type of interconnect contact includes conductors on a polymer substrate, similar to TAB tape, attached to the face of the dice. In this case the polymer substrate may be difficult to align and attach to the dice.

In addition to forming reliable interconnect contacts between the die contacts and the terminal contacts, it is preferable that the fabrication method be performed at the wafer level wherein multiple components are fabricated on a substrate, such as a wafer or a panel, which can then be singulated into individual components. Further, it is preferable that the fabrication method be capable of being performed using conventional equipment and materials.

The present invention is directed to an improved semiconductor component, and to a wafer level method for fabricating the component, in large volumes, at low costs, and with minimal defects.

SUMMARY OF THE INVENTION

In accordance with the present invention an improved semiconductor component, a method for fabricating the component, and systems incorporating the component are provided.

The component includes a semiconductor die having a pattern of die contacts, such as bond pads or redistribution pads, in electrical communication with integrated circuits contained on the die. The component also includes interconnect contacts bonded to the die contacts, and encapsulated in an insulating layer. The interconnect contacts can comprise posts, studs, bumps, balls or ribbons formed using conventional equipment. The component also includes terminal contacts bonded directly to the interconnect contacts. In addition, the interconnect contacts can include metallization layers to facilitate bonding of the terminal contacts.

An alternate embodiment component includes a pattern of conductors on the insulating layer in physical contact with the interconnect contacts, and having bonding pads for the terminal contacts. In this embodiment the terminal contacts can have a pitch and a pattern that are different than the pitch and pattern of the die contacts. For example, the terminal contacts can have a fan out configuration relative to the die contacts and can be arranged in a dense area array, such as a ball grid array (BGA) or fine ball grid array (FBGA).

The method for fabricating the component includes the steps of providing a substrate containing multiple semiconductor dice, bonding the interconnect contacts to the die contacts, and forming an insulating layer on the dice configured to encapsulate the interconnect contacts while leaving the tip portions thereof exposed. The insulating layer can be formed by blanket deposition of a polymer material on the interconnect contacts, followed by etching back to a thickness that is less than a height of the interconnect contacts. Alternately, the insulating layer can be deposited on the interconnect contacts with a thickness that is less than the height thereof, such that the tip portions remain exposed, and an etch back step is not required. The method also includes the steps of forming the terminal contacts on the interconnect contacts, and singulating the substrate into a plurality of separate components.

A method for fabricating the alternate embodiment component includes the additional steps of forming the pattern of conductors on the insulating layer in electrical communication with the interconnect contacts, forming the terminal contacts in electrical communication with the conductors, and forming an insulating layer on the conductors.

In each embodiment, the component can be used to construct systems such as MCM packages, multi chip modules and circuit boards.

BRIEF DESCRIPTION OF THE DRAWINGS

FIG. 2A is a plan view taken along line 2A—2A of FIG. 1A illustrating multiple semiconductor dice on a substrate;

FIG. 2B is an enlarged cross sectional view taken along line 2B of FIG. 1A illustrating a die contact;

FIG. 2C is an enlarged plan view of a portion of FIG. 2A taken along line 2C illustrating the die contact;

FIG. 2D is a plan view taken along line 2D—2D of FIG. 1B illustrating the substrate following bonding of interconnect contacts to the die contacts;

FIG. 2E is an enlarged plan view of a portion of FIG. 2D taken along line 2E illustrating an interconnect contact following bonding;

FIG. 2F is an enlarged cross sectional view taken along line 2F—2F of FIG. 1B illustrating an interconnect contact following bonding;

FIGS. 3A–3C are enlarged cross sectional views illustrating steps in a method for fabricating an alternate embodiment component;

FIG. 4A is an enlarged plan taken along line 4A—4A illustrating a die and a pattern of conductors on the die;

FIG. 4B is an enlarged cross sectional view taken along line 4B of FIG. 3C illustrating the alternate embodiment semiconductor component;

FIG. 5B is a schematic cross sectional view of the ball interconnect contact encapsulated in an insulating layer;

DETAILED DESCRIPTION OF THE PREFERRED EMBODIMENTS

As used herein, the term "semiconductor component" refers to an electronic element that includes a semiconductor die. Exemplary semiconductor components include semiconductor packages, BGA devices, flip chip devices and bumped semiconductor dice.

Figure 1A:
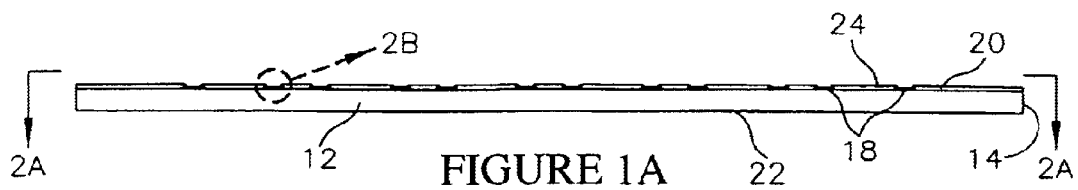
FIGS. 1A–1G are schematic cross sectional views illustrating steps in a method for fabricating a semiconductor component in accordance with the invention.
Figure 1B:
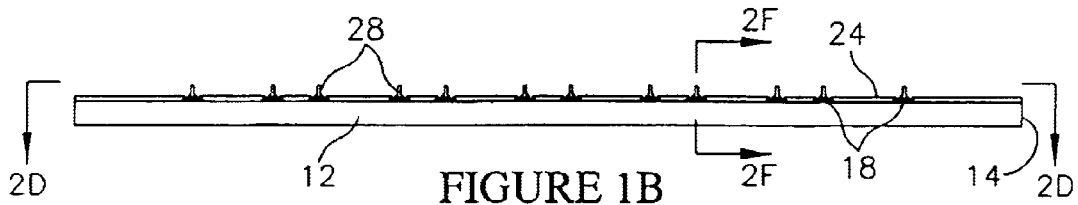
Figure 1C:
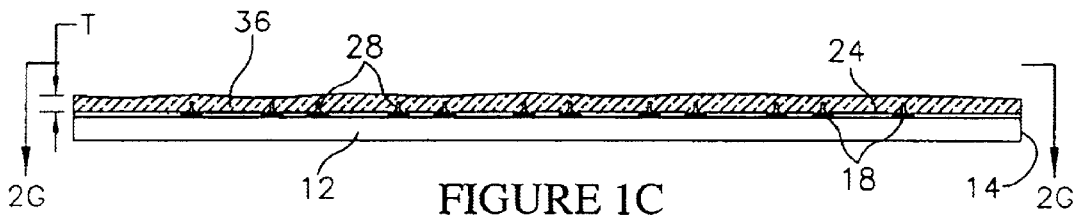
Figure 1D:
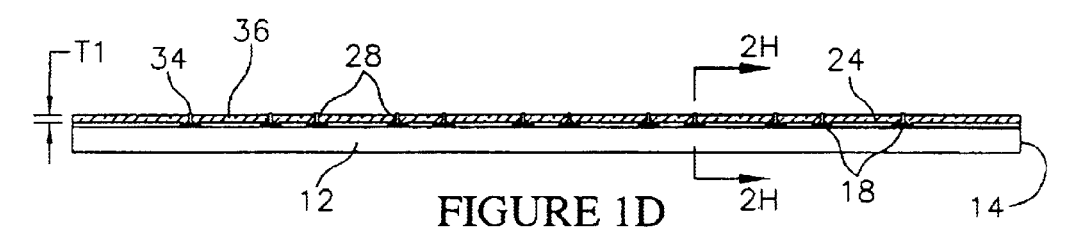
Figure 1E:
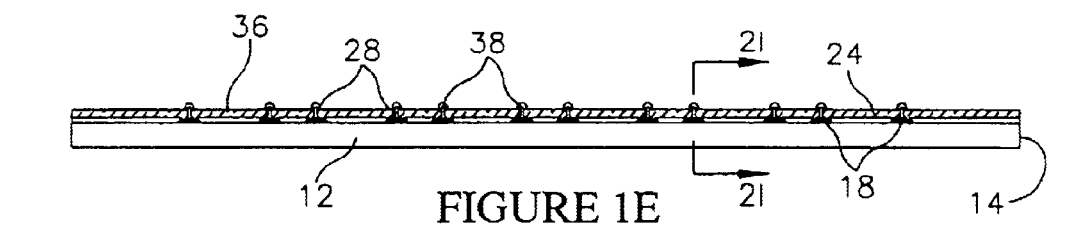
Figure 1F:
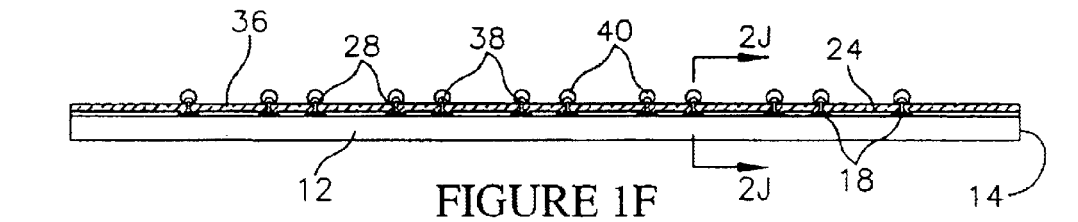
Figure 1G:
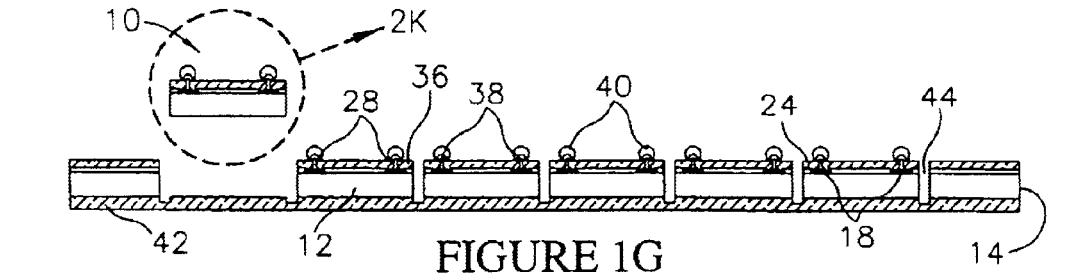

Referring to FIGS. 1A–1G, steps in the method for fabricating a semiconductor component 10 (FIG. 1G) in accordance with the invention are illustrated. Initially, as shown in FIGS. 1A and 2A, a plurality of semiconductor dice 12 are provided, for fabricating a plurality of semiconductor components 10 (FIG. 1G). The dice 12 can comprise conventional semiconductor dice having a desired configuration. For example, each die 12 can comprise a dynamic random access memory (DRAM), a static random access memory (SRAM), a flash memory, a microprocessor, a digital signal processor (DSP) or an application specific integrated circuit (ASIC). The dice 12 and the components 10 can have any polygonal shape. In the illustrative embodiment, the dice 12 and the components 10 are rectangular in shape, but other polygonal shapes, such as square or hexagonal can also be utilized.

As shown in FIG. 2A, the dice 12 are contained on a substrate 14. In the illustrative embodiment, the substrate 14 comprises a semiconductor wafer fabricated using conventional processes. However, it is to be understood that the method can be performed on a portion of a wafer, on a panel, or on any other substrate that contains multiple semiconductor dice. The dice 12 are formed on the substrate 14 with integrated circuits and semiconductor devices using techniques that are well known in the art. As also shown in FIG. 2A, the dice 12 are separated by streets 16 on the substrate 14.

As shown in FIG. 1A, each die 12 includes a circuit side 20 and a back side 22. Each die 12 also includes a pattern of die contacts 18 formed on the circuit side 20 thereof in electrical communication with the integrated circuits thereon. In the illustrative embodiment the die contacts 18 are the bond pads for the die 12. Alternately, the die contacts 18 can comprise redistribution contacts in electrical communication with the bond pads for the die 10. In addition, the die contacts 18 can have a desired size, spacing and pattern (e.g., dense area array). Further, the die contacts 18 preferably comprise a bondable metal such as Ni, Cu, Au, Ag, Pt, Pd, Sn, Zn and alloys of these metals.

As shown in FIGS. 2B and 2C, each die 12 also includes a die insulating layer 24 having openings 26 aligned with the die contacts 18. In the illustrative embodiment, the die insulating layer 24 is the die passivation layer. However, the die insulating layer 24 can comprise any electrically insulating material including glasses such as BPSG, polymers such as polyimide and resist, and oxides such as $SiO_2$. In addition, the openings 26 can be formed using a conventional process such as by forming a photo patterned mask (not shown) and etching the openings 26 through corresponding openings in the mask.

Referring to FIGS. 1B, 2D, 2E and 2F, interconnect contacts 28 are formed on the die contacts 18 in electrical communication with the integrated circuits on the dice 12. In the illustrative embodiment the interconnect contacts 28 comprise generally cylindrically shaped, elongated, metal posts.

As shown in FIG. 2F, each interconnect contact 28 includes a base portion 30 bonded to a die contact 18, a middle portion 32, and a tip portion 32. The interconnect contacts 28 can be formed using a conventional wire bonding apparatus configured for thermocompression bonding (T/C), thermosonic bonding (T/S), or wedge bonding (W/B) of a metal wire of a desired diameter D. The wire bonding apparatus can include a bonding tool adapted to manipulate the metal wire, and to sever the wire to form the interconnect contacts 28 with a desired height H. Suitable materials for the interconnect contacts 28 include Au, Pd, Ag, Cu, Ni and alloys of these metals.

The interconnect contacts 28 preferably have a diameter D and a height H selected such that they are relatively rigid structures that will maintain there shape and position during subsequent fabrication steps to be hereinafter described. In addition, the diameter D and the height H can be tuned to subsequent processing steps to be hereinafter described. A representative diameter D for the interconnect contacts 28 can be from 1 μm to 300 hundred μm or more. A representative height H for the interconnect contacts 28 can be from 1 μm to 10 μm.

Figure 2G:
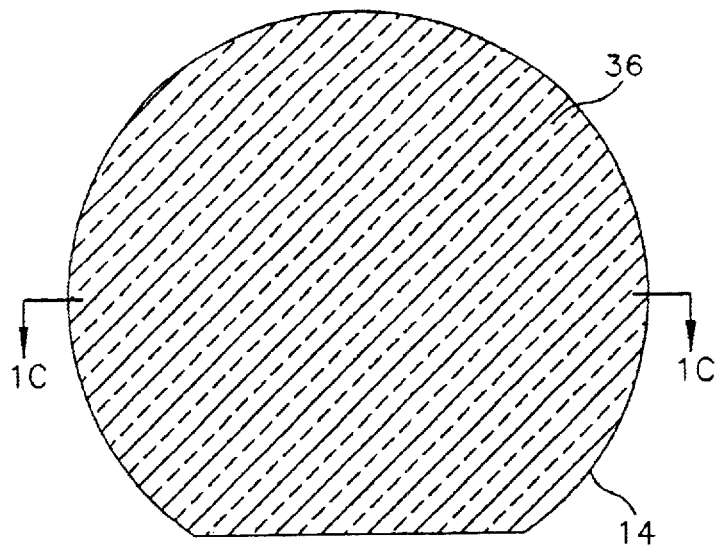
FIG. 2G is an enlarged cross sectional view taken along section line 2G—2G of FIG. 1C illustrating an insulating layer following deposition but prior to etch back.

Referring to FIG. 1C, following forming of the interconnect contacts 28, an electrically insulating layer 36 is deposited on the dice 12 and on the interconnect contacts 28. As shown in FIG. 2G, the insulating layer 36 can be blanket deposited such that is covers the entire circuit side 20 of the substrate 14. In addition, the insulating layer 36 can have a thickness T that is greater than or equal to the height H of the interconnect contacts 28. The insulating layer 36 can comprise a curable polymer material such as a silicone, a polyimide, an epoxy or a thick film resist. In addition, the polymer material can include fillers, such as silicates, configured to reduce the coefficient of thermal expansion (CTE) and adjust the viscosity of the polymer material. One suitable curable polymer material is manufactured by Dexter Electronic Materials of Rocky Hill, Conn. under the trademark "HYSOL" FP4450.

The insulating layer 36 can be blanket deposited using a suitable deposition process such as deposition through a nozzle, screen printing, stenciling, a spin resist process, a dry film process, or a stereographic lithographic process. One suitable nozzle deposition apparatus for depositing the insulating layer 36, also known as a material dispensing system, is manufactured by Asymtek of Carlsbad, Calif. Preferably deposition of the insulating layer 36 is performed without deforming, or altering the position and alignment of the interconnect contacts 28. In this regard the diameter D (FIG. 2F) and height H (FIG. 2F) of the interconnect contacts 28 can be selected to provide a relatively robust structure that will resist deformation and misalignment.

Following deposition, the insulating layer 36 can be cured to harden. For example, curing can be performed by placing the substrate 14 in an oven at a temperature of about 90° to 165° C. for about 30 to 60 minutes.

Figure 2H:
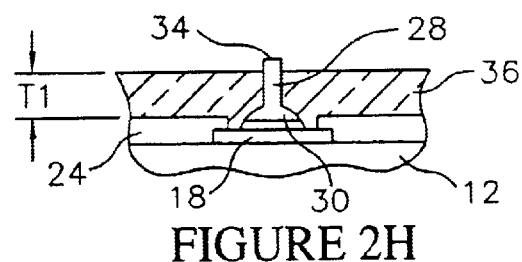
FIG. 2H is an enlarged cross sectional view taken along section line 2H—2H of FIG. 1D illustrating the interconnect contact following etch back of the insulating layer.

Referring to FIG. 1D, following deposition and curing of the insulating layer 36, an etch back step can be performed. During the etch back step, the insulating layer 36 is etched to reduce the thickness T thereof, and to expose the interconnect contacts 28. As shown in FIG. 2H, following the etch back step the insulating layer 36 has a thickness T1 that is less than the height H of the interconnect contacts 28. The tip portions 34 of the interconnect contacts 28 are thus exposed while the middle portions 32 and the base portions 30 of the interconnect contacts 28 are encapsulated or embedded in the insulating layer 36. By way of example, the etch back step can be controlled such that the height of the exposed tip portions of the interconnect contacts 28 is from approximately 100 Å to 50 µm or more. However, this height can be also tuned to subsequent processing steps to be hereinafter described.

The etch back step can be performed using a wet etch process, a dry etch process or a plasma etching process. For example, depending on the material for the insulating layer 36, a wet etch process can be performed using an etchant such as tetramethylammoniumhydroxide (TMAH), or potassium hydroxide (KOH).

Rather than forming the insulating layer 36 using blanket deposition and an etch back step, the insulating layer 36 can be formed by deposition to an initial thickness T1. In this case the deposition step can be controlled such that the tip portions 34 of the interconnect contacts 28 remain exposed.

In either case the interconnect contacts 28 are encapsulated, or embedded in the insulating layer 36, such that the insulating layer 36 protects, rigidities and electrically insulates the interconnect contacts 28. In addition, as will be further explained, the tip portions 34 of the interconnect contacts 28 provide an aligned, robust structure for forming terminal contacts 40 (FIG. 1G) or conductors 46 (FIG. 4A) to be hereinafter described.

Referring to FIG. 1E, following the etch back step, (or alternately following deposition of the insulating layer 36 if no etch back is used), metallization layers 38 are formed on the tip portions 34 of the interconnect contacts 28. The metallization layers 38 can be formed using a suitable deposition process such as electroless plating, electrolytic plating or CVD. The metallization layer 38 are similar in function to under bump metallization layers used for forming bumped contacts for "C4" or "flip chip" devices. As such, the metallization layers 38 preferably comprise a metal, or metal alloy, that permits bonding of terminal contacts 40 to the interconnect contacts 28. Suitable metals include Ni, Au and Cu.

Figure 2I:
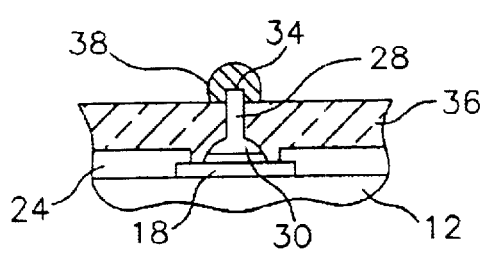
FIG. 2I is an enlarged cross sectional view taken along section line 2I—2I of FIG. 1E illustrating the interconnect contact following forming of a metallization layer thereon.
Figure 2J:
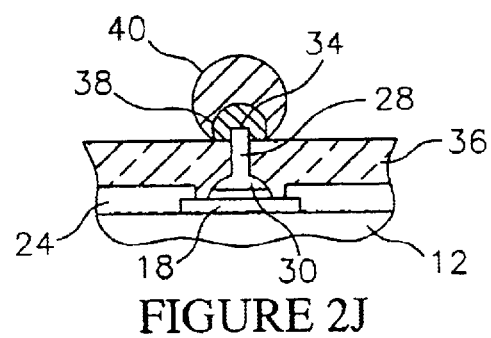
FIG. 2J is an enlarged cross sectional view taken along section line 2J—2J of FIG. 1F illustrating a terminal contact bonded to the interconnect contact.

As shown in FIG. 2I, in the illustrative embodiment, the metallization layers 38 comprise generally spherically shaped balls having diameters that completely cover the cylindrical tip portions 34 of the interconnect contacts 28. In addition, the metallization layers 38 increase the height of the interconnect contacts 28 by a distance approximately equal to the diameters thereof.

Referring to FIG. 1F, following forming of the metallization layers 38, the terminal contacts 40 are formed on the metallization layers 38 and on the interconnect contacts 28. This step can be performed by bonding, or depositing, the terminal contacts 40 on the metallization layers 38. The terminal contacts 40 can comprise metal bumps formed on the metallization layers 38 using a suitable deposition process, such as stenciling and reflow of a solder alloy. Suitable solder alloys include eutectic solders such as 95% Pb/5% Sn, 60% Pb/40% Sn, 63% In/37% Sn, and 62% Pb/36% Sn/2% Ag. Rather than being formed of solder, the terminal contacts 40 can comprise another metal, or a conductive polymer material.

The terminal contacts 40 can also be formed by electrolytic deposition, by electroless deposition, or by bonding pre-fabricated balls to the interconnect contacts 28. A ball bumper can also be employed to bond pre-fabricated balls. A suitable ball bumper is manufactured by Pac Tech Packaging Technologies of Falkensee, Germany. The terminal contacts 40 can also be formed using a conventional wire bonder apparatus adapted to form a ball bond, and then to sever the attached wire.

In addition, the diameter of the terminal contacts 40 can be selected as required. A representative diameter can be from about 0.005-in (0.127 mm) to about 0.016-in (0.400 mm) or larger. In the illustrative embodiment, the terminal contacts 40 have a pitch that matches the pitch of the die contacts 18. A representative pitch can be from about 0.004-in (0.100 mm) to about 0.039-in (1.0) mm or more. In general, the size of the metallization layers 38 and the height of the exposed tip portions 34 of the interconnect contacts 28 can be tuned to the size of the terminal contacts 40. For example, terminal contacts 40 having a diameter of about 300 µm can be formed on metallization layers 38 having a diameter of about 100 µm and on exposed tip portions 34 having a height of from 5 µm to 90 µm.

Also in the illustrative embodiment the pattern of the terminal contacts 40 matches the pattern of the die contacts 18. This pattern can comprise any suitable pattern such as edge connect, end connect, or a dense area array such as a ball grid array (BGA) or a fine ball grid array (FBGA).

Referring to FIG. 1G, following formation of the terminal contacts 40, a dicing tape 42 can be applied to the back side 22 of the substrate 14. In addition, a singulating step is performed to singulate the components 10 from the substrate 14 and from one another. During the singulating step, grooves 44 are sawn, or otherwise formed in the substrate 14 from the circuit side 20 to the back side 22 thereof. The singulating step can be performed using a dicing saw having saw blades with a selected width. Alternately the singulating step can be performed using another singulation method, such as cutting with a laser or a water jet, or by etching the substrate 14 with a suitable wet or dry etchant.

Figure 2K:
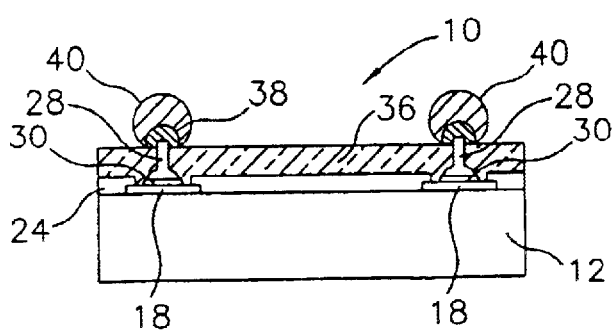
FIG. 2K is an enlarged cross sectional view taken along line 2K of FIG. 1G illustrating the semiconductor component.

Referring to FIG. 2K, the singulated component 10 is illustrated. The component 10 includes the die 12 and the die contacts 18 in electrical communication with the integrated circuits thereon. The component 10 also includes the interconnect contacts 28 on the die contacts 18 encapsulated by the insulating layer 36. In addition, the component 10 includes the terminal contacts 40 bonded to the tip portions 34 of the interconnect contacts 28. The terminal contacts 40 have the same pitch and pattern as the die contacts 18.

Referring to FIGS. 3A–3C, steps in a method for fabricating an alternate embodiment component 10A (FIG. 3C) are illustrated. For constructing the component 10A, the substrate 14 with the dice 12 and the die contacts 18 is provided, substantially as shown and described in FIG. 1A. In addition, interconnect contacts 28 are formed on the die contacts 18, substantially as shown and described in FIG. 1B. Further, the insulating layer 36 is deposited and etched back substantially as shown and described in FIGS. 1C and 1D.

Referring to FIG. 3A, the interconnect contacts 28 include tip portions 34 that are not encapsulated in the insulating layer 36. In addition, conductors 46 are formed on the insulating layer 36 in physical and electrical contact with the tip portions 34 of the interconnect contacts 28.

As shown in FIG. 4A, the conductors 46 include bonding pads 48 in a selected pattern 50. For simplicity, the selected pattern is a single row along the center of the die 12. However, in actual practice the selected pattern 50 can comprise a dense area array, such as a ball grid array (BGA) or fine ball grid array (FBGA). The conductors 46 "redistribute" the pattern of the interconnect contacts 28 and the die contacts 18 into the selected pattern 50.

The conductors 46 can be formed using a subtractive process by depositing and etching a blanket deposited metal layer, or using an additive process by direct deposition through a mask, such as an electroless or electrolytic plating process. The conductors 46 preferably comprise a highly conductive metal, such as Cu, Al, Ti, Tu, Pt, Mb, Ni, Au and Ir. A thickness of the conductors 46 can be selected as required with from 1 μm to 50 μm being representative. In addition, the widths and lengths of the conductors 46 can be selected as required.

The bonding pads 48 can be formed at the same time as the conductors 46 using the same subtractive or additive process, or can be formed using a separate process. In the illustrative embodiment, the bonding pads 48 are generally circular in shape and have a diameter about the same as the diameter of the terminal contacts 40. In addition, the bonding pads 48 can include metallization layers 52, which function as under bump metallization layers, substantially as previously described for metallization layers 38 (FIG. 2I). The metallization layers 52 can be formed of the same materials as previously described for the metallization layer 38 using a deposition process such as electroless plating, electrolytic plating, CVD, or sputtering. However, in this case the metallization layers 52 can be substantially planar, and have an outline matching that of the bonding pads 48.

Referring to FIG. 3B, following forming of the redistribution conductors 46 and the bonding pads 48, the terminal contacts 40 are formed on the bonding pads 48. The terminal contacts 40 can be formed substantially as previously described. As also shown in FIG. 3B, an outer insulating layer 54, can be formed on the dice 12 and the conductors 46. The outer insulating layer 54 can comprise an electrically insulating polymer such as polyimide or resist. In the illustrative embodiment, the outer insulating layer 54 also functions as a rigidifying polymer support layer for the terminal contacts 40, substantially as described in U.S. Pat. No. 6,180,504 B1 to Farnworth et al., which is incorporated herein by reference.

Alternately, the outer insulating layer 54 can be initially formed on the conductors 46, and then the terminal contacts 40 can be formed on the bonding pads 48. In this case, the outer insulating layer 54 can include openings or vias aligned with the bonding pads 48 wherein the terminal contacts 40 are formed. In addition, the outer insulating layer 54 can be fabricated using a photoimageable polymer, such as a resist used to construct conventional solder masks.

Referring to FIG. 3C, following forming of the terminal contacts 40 and the outer insulating layer 54 a singulation step is performed substantially as shown and previously described in FIG. 1G.

As shown in FIG. 4B, the singulated component 10A includes the die 12 and the die contacts 18 in electrical communication with the integrated circuits thereon. The component 10A also includes the interconnect contacts 28 on the die contacts 18 encapsulated by the insulating layer 36 and the redistribution conductors 46 in electrical communication with the interconnect contacts 28. In addition, the component 10A includes the terminal contacts 40 bonded to the bonding pads 48. The terminal contacts 40 can have a selected pitch and pattern such as a ball grid array (BGA) or fine ball grid array (FBGA), such that a high input/output capability is provided for the component 10A.

Figure 5A:
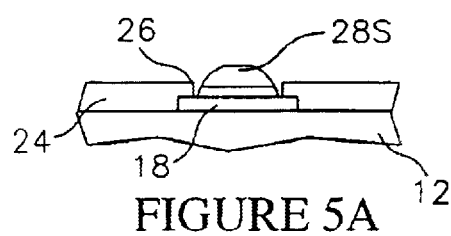
FIG. 5A is a schematic cross sectional view of an alternate embodiment stud interconnect contact.
Figure 5B:
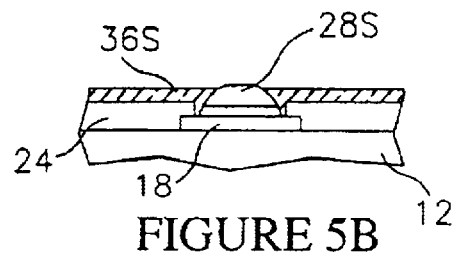
FIG. 5B is a schematic cross sectional view of the stud interconnect contact encapsulated in an insulating layer.

Referring to FIGS. 5A–5H alternate embodiment interconnect contacts are illustrated. In FIG. 5A, a stud interconnect contact 28S comprises a stud or stud bump. The stud interconnect contact 28S can be formed as previously described using a wire bonder configured to bond and to sever a metal wire on the die contact 18. However, in this case the wire bonder can be controlled to form a stud or stud bump rather than a post. FIG. 5B illustrates the stud interconnect contact 28S encapsulated in an insulating layer 36S with a tip portion thereof exposed substantially as previously described for interconnect contact 28.

Figure 5C:
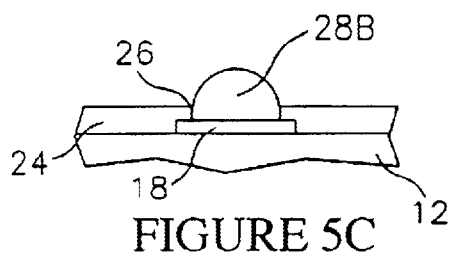
FIG. 5C is a schematic cross sectional view of an alternate embodiment bump interconnect contact.
Figure 5D:
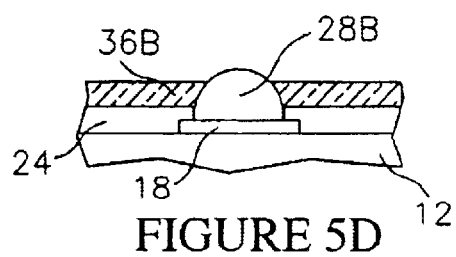
FIG. 5D is a schematic cross sectional view of the bump interconnect contact encapsulated in an insulating layer.

In FIG. 5C, a bump interconnect contact 28B comprises a metal bump. The bump interconnect contact 28B can be formed using a ball bumper apparatus, or by deposition of a metal bump on the die contact 18 using a deposition process, such as screen printing, stenciling, electroless deposition, CVD or sputtering. FIG. 5D illustrates the bump interconnect contact 28B encapsulated in an insulating layer 36B with a tip portion thereof exposed substantially as previously described for interconnect contact 28.

Figure 5E:
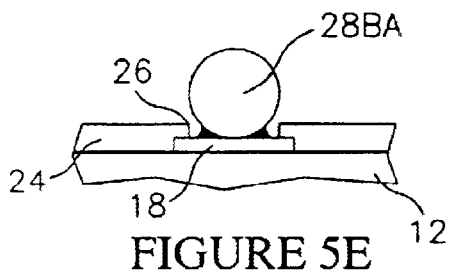
FIG. 5E is a schematic cross sectional view of an alternate embodiment ball interconnect contact.
Figure 5F:
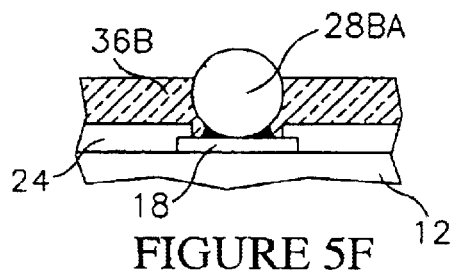
FIG. 5G is a schematic cross sectional view of an alternate embodiment ribbon interconnect contact.
FIG. 5H is a schematic cross sectional view of the ribbon interconnect contact encapsulated in an insulating layer.

In FIG. 5E, a ball interconnect contact 28BA comprises a metal ball bonded to the die contact 18. The ball interconnect contact 28BA can be formed by bonding a preformed metal ball to the die contact 18. For example, a solder ball can be bonded using solder reflow process. FIG. 5E illustrates the ball interconnect contact 28BA encapsulated in an insulating layer 36BA with a tip portion thereof exposed substantially as previously described for interconnect contact 28.

Figure 5G:
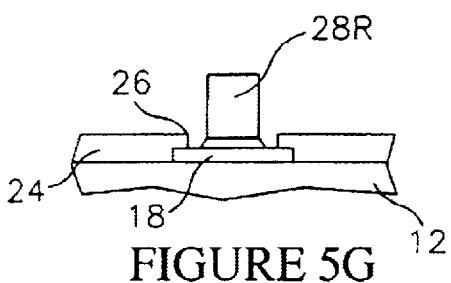
Figure 5H:
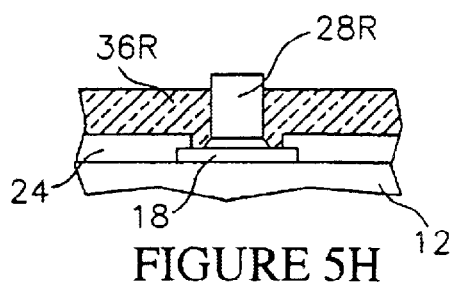

In FIG. 5G, a ribbon interconnect contact 28R comprises a metal ribbon bonded to the die contact 18. The ribbon interconnect contact 28R can be formed by bonding a metal ribbon to the die contact 18 using a ribbon bonder. FIG. 5H illustrates the ribbon interconnect contact 28R encapsulated in an insulating layer 36R with a tip portion thereof exposed substantially as previously described for interconnect contact 28.

Figure 6:
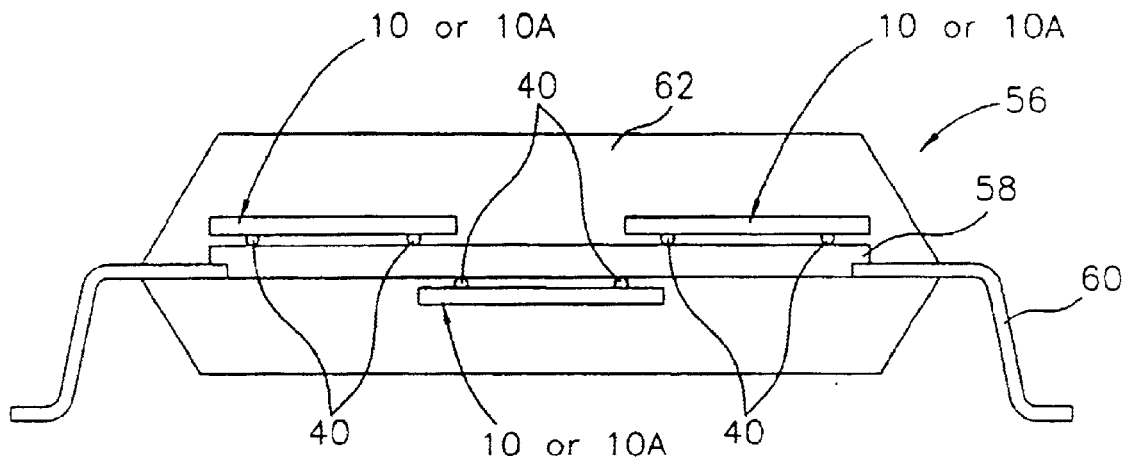
FIG. 6 is a schematic cross sectional view of a system in a package (SIP) that includes components constructed in accordance with the invention.
Figure 7:
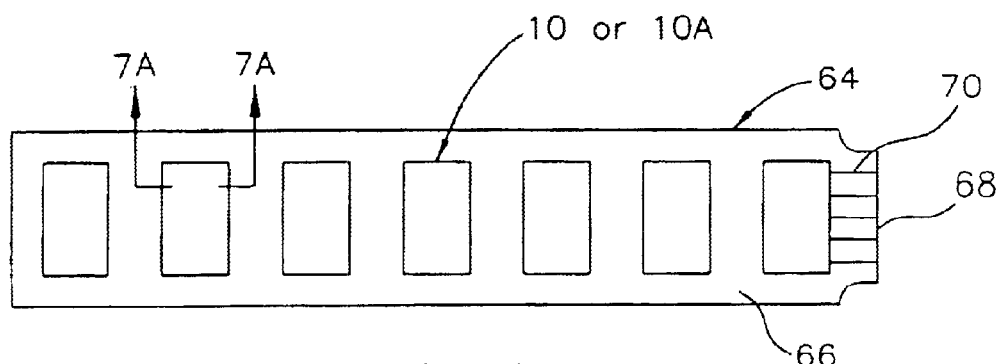
FIG. 7 is a plan view of a module system that includes components constructed in accordance with the invention.
Figure 7A:
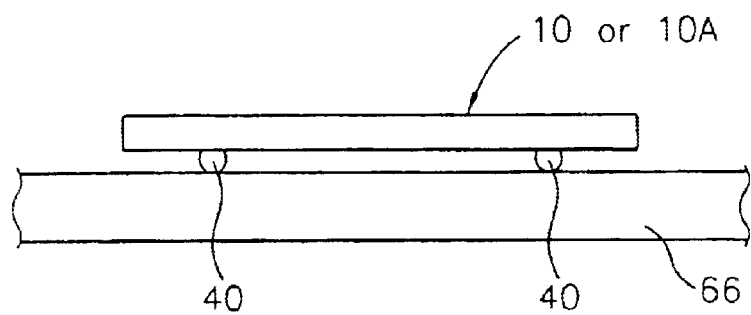
FIG. 7A is a cross sectional view taken along section line 7A—7A of FIG. 7.

Referring to FIGS. 6, 7 and 7A, electronic systems constructed using components 10 or 10A fabricated in accordance with the invention are illustrated.

In FIG. 6, a system in a package (SIP) 56 is constructed with one or more components 10 or 10A. This type of package is also referred to as a multi chip module MCM package. The system in a package (SIP) 56 can be configured to perform a desired function such as micro processing. The system in a package (SIP) 56 includes a substrate 58 having terminal leads 60. The components 10 or 10A can be flip chip mounted to the substrate 58, with the terminal contacts 40 thereon in electrical communication with the terminal leads 60. The system in a package (SIP) 56 also includes a package body 62 encapsulating the components 10 or 10A and the substrate 58.

Referring to FIGS. 7 and 7A, a multi chip module system 64 constructed with one or more components 10 or 10A is illustrated. The multi chip module system 64 includes a module substrate 66 having an edge connector 68, and a plurality of conductors 70 in electrical communication with the edge connector 68. The components 10 or 10A can be flip chip mounted to the module substrate 66, with the terminal contacts 40 thereon in electrical communication with the conductors 70 and the edge connector 68.

Thus the invention provides an improved semiconductor component having metal post interconnects and an improved method for fabricating the component. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:
   providing a semiconductor die comprising a plurality of die contacts having a pattern;
   forming a plurality of interconnect contacts on the die contacts having tip portions;
   forming an insulating layer on the die and on the interconnect contacts with the tip portions exposed;
   forming a plurality of conductors and bonding pads on the insulating layer in electrical communication with the tip portions configured to redistribute the pattern of the die contacts to a selected pattern; and
   forming a plurality of terminal contacts on the bonding pads.

2. The method of claim 1 wherein the selected pattern comprises a grid array.

3. The method of claim 1 wherein the terminal contacts comprise balls and the selected pattern comprises a ball grid array.

4. The method of claim 1 wherein the forming the insulating layer step comprises depositing and then etching a polymer material to expose the tip portions.

5. The method of claim 1 wherein the forming the insulating layer step comprises depositing the insulating layer to a thickness less than a height of the interconnect contacts.

6. The method of claim 1 wherein the forming the interconnect contacts step comprises bonding wires, studs or ribbons to the die contacts.

7. The method of claim 1 wherein the forming the interconnect contacts step comprises depositing metal bumps on the die contacts.

8. The method of claim 1 wherein the forming the interconnect contacts step comprises bonding balls to the die contacts.

9. A method for fabricating a semiconductor component comprising:
   providing a substrate comprising a plurality of semiconductor dice comprising a plurality of die contacts having a pattern;
   forming a plurality of interconnect contacts on the die contacts having tip portions;
   forming an insulating layer on the dice configured to substantially encapsulate the interconnect contacts with the tip portions exposed;
   forming a plurality of conductors and bonding pads on the insulating layer in electrical communication with the tip portions configured to redistribute the pattern of the die contacts to a selected pattern; and
   forming a plurality of terminal contacts on the bonding pads.

10. The method of claim 9 wherein the forming the insulating layer step comprises depositing and etching a polymer material.

11. The method of claim 9 wherein the forming the interconnect contacts step comprises wire bonding wires to the die contacts and then severing the wires.

12. The method of claim 9 wherein the forming the terminal contacts step comprises forming metal bumps or balls on the bonding pads.

13. The method of claim 9 wherein the forming the interconnect contacts step comprises bonding studs or ribbons to the die contacts.

14. The method of claim 9 wherein the forming the interconnect contacts step comprises depositing metal bumps on the die contacts.

15. The method of claim 9 wherein the forming the interconnect contacts step comprises bonding balls to the die contacts.

16. A method for fabricating a semiconductor component comprising:
   providing a substrate comprising a plurality of semiconductor dice having a plurality of die contacts in a first pattern;
   forming a plurality of interconnect contacts on the die contacts having tip portions;
   forming an insulating layer on the dice and on the interconnect contacts with the tip portions exposed;
   forming a plurality of conductors on the insulating layer in physical contact with the tip portions and a plurality of bonding pads on the insulating layer in electrical communication with the conductors in a second pattern; and
   forming a plurality of terminal contacts on the bonding pads.

17. The method of claim 16 wherein the forming the insulating layer step comprises depositing and etching a polymer layer to a thickness less than a height of the interconnect contacts.

18. The method of claim 16 wherein the forming the insulating layer step comprises depositing a polymer material to a thickness less than a height of the interconnect contacts.

19. The method of claim 16 wherein the terminal contacts comprise balls and the second pattern comprises a grid array.

20. The method of claim 16 wherein the forming the interconnect contacts step comprises wire bonding wires to the die contacts and then severing the wires.

21. The method of claim 16 wherein the substrate comprises a semiconductor wafer.

22. The method of claim 16 wherein the interconnect contacts comprise an element selected from the class consisting of posts, studs, bumps, balls and ribbons.

23. A method for fabricating a semiconductor component comprising:
providing a substrate comprising a plurality of semiconductor dice comprising a plurality of die contacts in a pattern;
forming a plurality of interconnect contacts on the die contacts;
encapsulating the interconnect contacts in an insulating layer having a thickness greater than or equal to the height;
etching the insulating layer to expose tip portions of the interconnect contacts;
forming a plurality of conductors on the insulating layer in physical and electrical contact with the tip portions configured to redistribute the pattern of the die contacts; and
forming a plurality of terminal contacts on the insulating layer in electrical communication with the conductors.

24. The method of claim 23 wherein the terminal contacts are generally spherically shaped.

25. The method of claim 23 wherein the terminal contacts comprise metal bumps or balls.

26. The method of claim 23 wherein the etching step comprises wet etching, dry etching or plasma etching.

27. The method of claim 23 wherein the forming the interconnect contacts step is performed using a wire bonder.

28. The method of claim 23 wherein the substrate comprises a semiconductor wafer.

29. The method of claim 23 wherein the interconnect contacts comprise metal posts having a diameter of from 1 $\mu$m to 300 $\mu$m.

30. A method for fabricating a semiconductor component comprising:
providing a substrate comprising a plurality of semiconductor dice having a plurality of die contacts;
wire bonding a plurality of metal wires to the die contacts to form metal posts on the die contacts having a height;
encapsulating the metal posts in an insulating layer having a thickness greater than or equal to the height;
etching the insulating layer to expose tip portions of the metal posts;
forming a plurality of conductors on the insulating layer in electrical communication with the tip portions and a plurality of bonding pads on the insulating layer in an area array in electrical communication with the conductors; and
forming a plurality of terminal contacts on the bonding pads.

31. The method of claim 30 wherein the height is about 1 $\mu$m to 10 $\mu$m and the terminal contacts have a diameter of about 100 $\mu$m.

32. The method of claim 30 wherein the terminal contacts comprise metal bumps or balls in a grid array.

33. The method of claim 30 wherein the etching step comprises wet etching, dry etching or plasma etching.

34. The method of claim 30 wherein the wire bonding step is performed using a wire bonder.

35. The method of claim 30 wherein the substrate comprises a semiconductor wafer.

36. The method of claim 30 wherein the metal posts have a diameter of from 1 $\mu$m to 300 $\mu$m.

37. A method for fabricating a semiconductor component comprising:
providing a substrate comprising a plurality of semiconductor dice comprising a plurality of die contacts;
wire bonding a metal wire to each die contact and severing the wire to form a plurality of metal posts on the die contacts having tip portions and a height;
forming a polymer insulating layer on the dice encapsulating the metal posts having a thickness greater than the height;
etching the polymer insulating layer to expose the tip portions;
forming a plurality of conductors on the polymer insulating layer in contact with the tip portions;
forming a plurality of terminal contacts on the polymer insulating layer in electrical communication with the conductors; and
singulating the dice from the substrate.

38. The method of claim 37 wherein the interconnect contacts comprise metal posts having a diameter of from 1 $\mu$m to 300 $\mu$m.

39. The method of claim 37 wherein the polymer insulating layer comprises a material selected from the group consisting of silicone, polyimide, epoxy and resist.

40. The method of claim 37 wherein the terminal contacts are generally spherically shaped.

41. A method for fabricating a semiconductor component comprising:
providing a substrate comprising a plurality of semiconductor dice comprising a plurality of die contacts in a pattern;
wire bonding a metal wire to each die contact then severing the wire to form a plurality of metal posts on the die contacts having tip portions and a height;
forming an insulating layer on the dice encapsulating the metal posts having a thickness less than the height such that the tip portions are exposed;
forming a plurality of conductors and bonding pads on the insulating layer in electrical communication with the tip portions configured to redistribute the pattern of the die contacts to a selected pattern;
forming a plurality of terminal contacts on the bonding pads; and
singulating the dice from the substrate.

42. The method of claim 41 wherein the forming the insulating layer step comprises forming a polymer layer to a first thickness greater than the thickness then etching the polymer layer to the thickness.

43. The method of claim 41 wherein the forming the insulating layer step comprises depositing a polymer material to the thickness.

44. The method of claim 41 wherein the bonding pads are arranged in an area array.

45. The method of claim 41 wherein the conductors include metallization layers for the terminal contacts.

46. The method of claim 41 further comprising forming an insulating layer on the conductors prior to the singulating step configured to rigidify the terminal contacts.

47. The method of claim 41 further comprising forming an outer insulating layer on the conductors prior to the forming the terminal contacts step.

* * * * *